United States Patent [19]
Akamatsu et al.

[11] Patent Number: 5,764,566
[45] Date of Patent: Jun. 9, 1998

[54] STATIC RANDOM ACCESS MEMORY CAPABLE OF REDUCING STENDLY POWER CONSUMPTION AND OFF-LEAKAGE CURRENT

[75] Inventors: Hironori Akamatsu; Toru Iwata, both of Osaka; Hisakazu Kotani, Hyogo, all of Japan

[73] Assignee: Matsushita Electric Industrial Co., Ltd., Osaka, Japan

[21] Appl. No.: 893,682

[22] Filed: Jul. 11, 1997

Related U.S. Application Data

[62] Division of Ser. No. 739,392, Oct. 29, 1996, abandoned.

[30] Foreign Application Priority Data

Oct. 31, 1995 [JP] Japan .................. 7-282717

[51] Int. Cl.$^6$ .................................................. G11C 11/413
[52] U.S. Cl. .................... 365/156; 365/229; 365/227; 365/233; 365/189.05
[58] Field of Search ..................... 365/156, 227, 365/229, 233, 189.05

[56] References Cited

U.S. PATENT DOCUMENTS 4,149,268  4/1979  Waters ........................ 365/95
5,581,500  12/1996  D'Souza ....................... 365/154

FOREIGN PATENT DOCUMENTS 5-210976  8/1993  Japan ................... G11C 11/405
6-29834  2/1994  Japan ................... H03K 19/48

OTHER PUBLICATIONS

IEEE International Solid–State Circuits Conference "A 23ns 4Mb CMOS SRAM with 0.5uA Stanby Current", Feb. 15, 1990, pp. 130–131.

*Primary Examiner*—David C. Nelms
*Assistant Examiner*—Andrew Q. Tran
*Attorney, Agent, or Firm*—McDermott, Will & Emery

[57] ABSTRACT

When a memory chip is in a standby mode, a ground power supply line of a flip-flop forming a memory cell is intermittently placed in the floating state. A switching NMOS transistor is connected between the ground power supply line and a power supply VSS. The gate of the NMOS transistor is controlled by an activation signal. When entering the floating state, the ground power supply line is charged due to an off-leakage current flowing in the transistor of the memory cell. As a result, the voltage of the ground power supply line is increased from the voltage of the power supply VSS. Accordingly, the off-leakage current of the memory cell is reduced, whereby the standby-time power consumption of the memory chip is decreased. When the voltage of the ground power supply line keeps going up, it becomes impossible to read data held in the memory cell in a short time, resulting in the data being lost. In order to prevent the loss of the data, the switching NMOS transistor is made to intermittently turn on.

1 Claim, 17 Drawing Sheets

STATIC RANDOM ACCESS MEMORY CAPABLE OF REDUCING STENDLY POWER CONSUMPTION AND OFF-LEAKAGE CURRENT

This is a divisional application of application Ser. No. 08/739,392, filed Oct. 29, 1996, now abandoned.

BACKGROUND OF THE INVENTION

The present invention relates to data holding circuits such as semiconductor memories and latch circuits.

In recent years, semiconductor memories, such as DRAMs (dynamic random access memories) and SRAMs (static random access memories), with a mass storage capacity have been introduced. Such mass storage devices, however, tend to consume much electric power. Conventionally, the semiconductor industry has put a lot of effort into reducing electric power consumed at read operation time and at write operation time. However, for the case of portable equipment employing battery-driven semiconductor memories, in addition to achieving a reduction in electric power consumed by read/write operations, it is also important to reduce standby-time power consumption so that batteries have a longer life.

K. Sasaki et al. show a technique in their report entitled "A 23 ns 4 Mb CMOS SRAM with 0.5 µA Standby Current," ISSCC Digest of Technical Papers, February 1990, pp. 130–131. In accordance with this technique, a flip-flop necessary for an SRAM memory cell is composed of two CMOS inverters. A polysilicon PMOS transistor is employed as a load element for each of two NMOS transistors, whereby an SRAM with a lower standby current, in comparison with a technique employing a polysilicon resistor as a load element, can be realized. Additionally, the use of the polysilicon PMOS transistors of a 2-layer structure reduces memory cell area.

Such a technique, however, proves problematic. More specifically, the technique has off-leakage current problems of MOS transistors. This shows that the reduction of SRAM standby current is carried out without success.

An increase in the SRAM storage capacity tends to increase a total off-leakage current. Additionally, the reduction of MOS transistor threshold voltage is required when the voltage of power supply is decreased. However, such reduction in the MOS transistor threshold voltage causes the off-leakage current of individual MOS transistors to grow. Japanese Patent Application Pub. No. 5-210976 and Japanese Patent Application Pub. No. 6-29834 propose MT (multiple threshold)-CMOS techniques capable of being applicable to peripheral circuits of the semiconductor memory. In accordance with this MT-CMOS technology, a MOS transistor with a high threshold voltage is connected, as a switch, between a MOS transistor with a low threshold voltage and a power supply. It is arranged such that the switch, i.e., the high threshold voltage MOS transistor, is opened (turned off) at standby time. The provision of this switching transistor limits the transistor off-leakage current to low level.

However, this MT-CMOS technology is unable to reduce the off-leakage current of flip-flop type memory cells. The reason is that the MT-CMOS technology fails to prevent data, held in a memory cell on standby, from being lost.

SUMMARY OF THE INVENTION

Bearing in mind the above-described problems with the prior art techniques, the present invention was made.

Therefore, it is an object of the present invention to provide an improved technique for reducing, in a data holding circuit of a flip-flop type, the off-leakage current of transistors forming the data holding circuit, to reduce standby power consumption while at the same time preventing data held in a memory cell from being lost.

To achieve the object, the present invention provides the following technique. In accordance with the present invention, at least one of two power supply lines of a flip-flop constituting a data holding circuit in a semiconductor memory, is intermittently brought into the state of floating at standby time. For example, when one of the two power supply lines that is arranged on the ground side enters the floating state, the power supply line in the floating state is charged due to an off-leakage current flowing through a transistor of the flip-flop. This increases the power supply line voltage, therefore resulting in decreasing the transistor off-leakage current. However, if the voltage of the ground-side power supply line keeps increasing, this prevents data, held in the flip-flop, from being read out in a short time and the data is finally lost. In order to cope with such an unwanted situation, a power supply line of the flip-flop is intermittently brought into the state of floating at standby time.

DETAILED DESCRIPTION OF THE INVENTION

Figure 1:
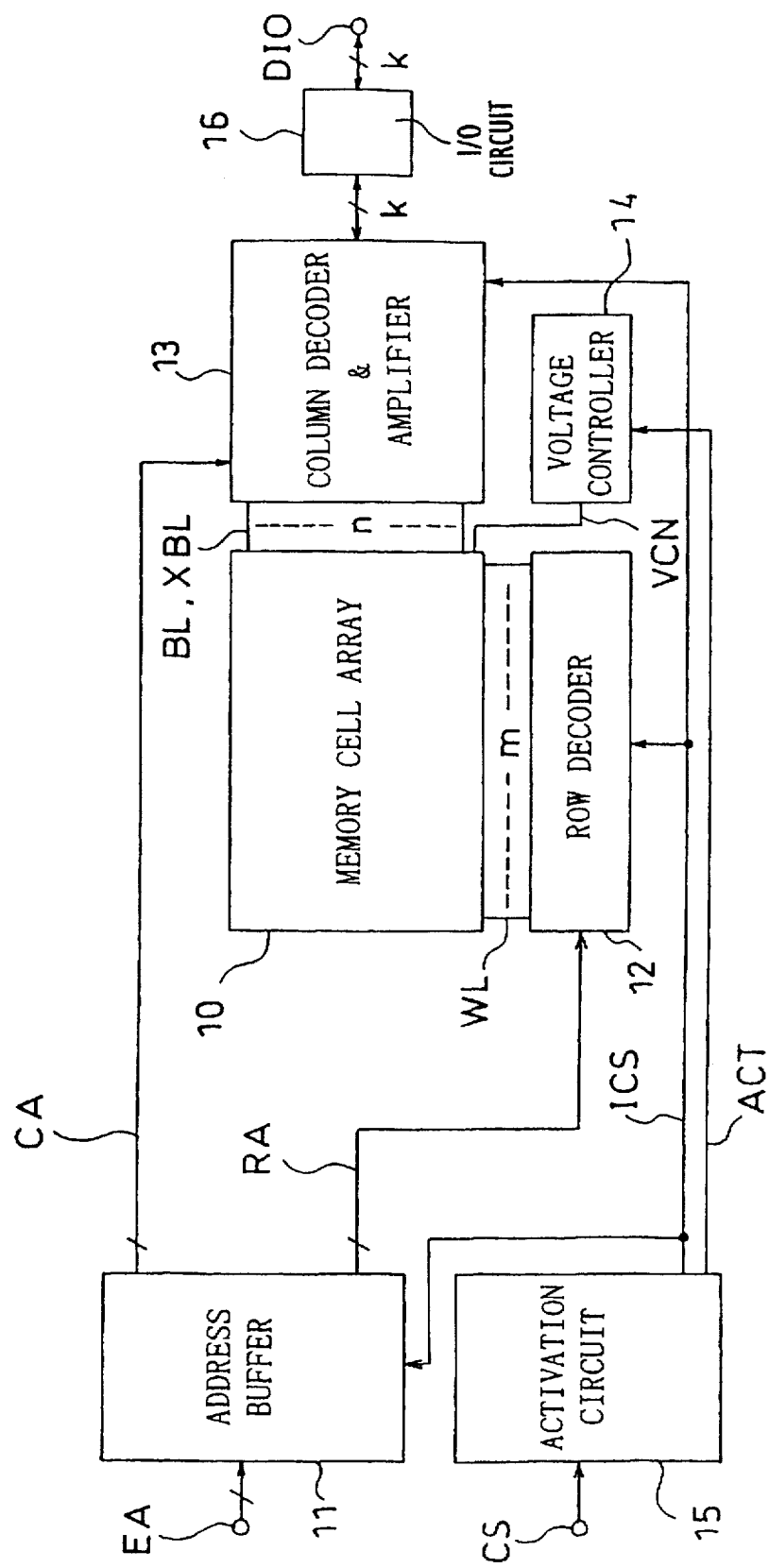
FIG. 1 is a block diagram showing the configuration of a semiconductor memory in accordance with an embodiment of the present invention.

With reference to FIG. 1, there is shown the configuration of an SRAM chip of an embodiment of this invention. This SRAM chip of FIG. 1 includes a memory cell array 10, an address buffer 11, a row decoder 12, a column decoder/amplifier (including a sense amplifier and a write amplifier) 13 (hereinafter called CDA) and an input and output (I/O) circuit 16. The memory cell array 10 contains m×n memory cells (not shown), m wordlines WL and n pairs of bitlines BL and XBL, where the numbers m and n are integers. The address buffer 11 receives an external address EA and provides a row address RA and a column address CA to the row decoder 12 and to the CDA 13, respectively. The row decoder 12 rises the voltage of one of the m wordlines WL of the memory cell array 10 that is selected according to the received row address RA. At the read time of the SRAM chip, the CDA 13 supplies to the I/O circuit 16 a data signal of k bits. These k bits are selected, according to the column address CA, from a data signal of n bits that are read onto n bitline pairs of BL and XBL from n memory cells coupled to a wordline WL selected by the row decoder 12. The number k is an integer less than the number n. The k-bit data signal, fed to the I/O circuit 16, is provided at a data terminal DIO to outside the SRAM chip. On the other hand, at the write time of the SRAM chip, the I/O circuit 16 provides a data signal of k bits, which is applied at the data terminal DIO from outside the SRAM chip, to the CDA 13. The CDA 13 provides the k-bit data signal so that the k-bit signal is written through k bitline pairs of BL and XBL into k memory cells of the foregoing n memory cells coupled to the wordline WL selected by the row decoder 12, wherein these k memory cells are selected according to the column address CA.

The SRAM chip, shown in FIG. 1, further includes a voltage controller 14 and an activation circuit 15. The voltage controller 14 is a circuit for controlling the voltage of ground power supply lines of flip-flops forming respective memory cells of the memory cell array 10, in other words the voltage controller 14 controls a cell power supply line voltage, VCN. The activation circuit 15 receives a chip select signal CS, generates an internal chip select signal ICS for activating the address buffer 11, the row decoder 12 and CDA 13 and generates an activation signal ACT for controlling the operation of the voltage controller 14.

Figure 2:
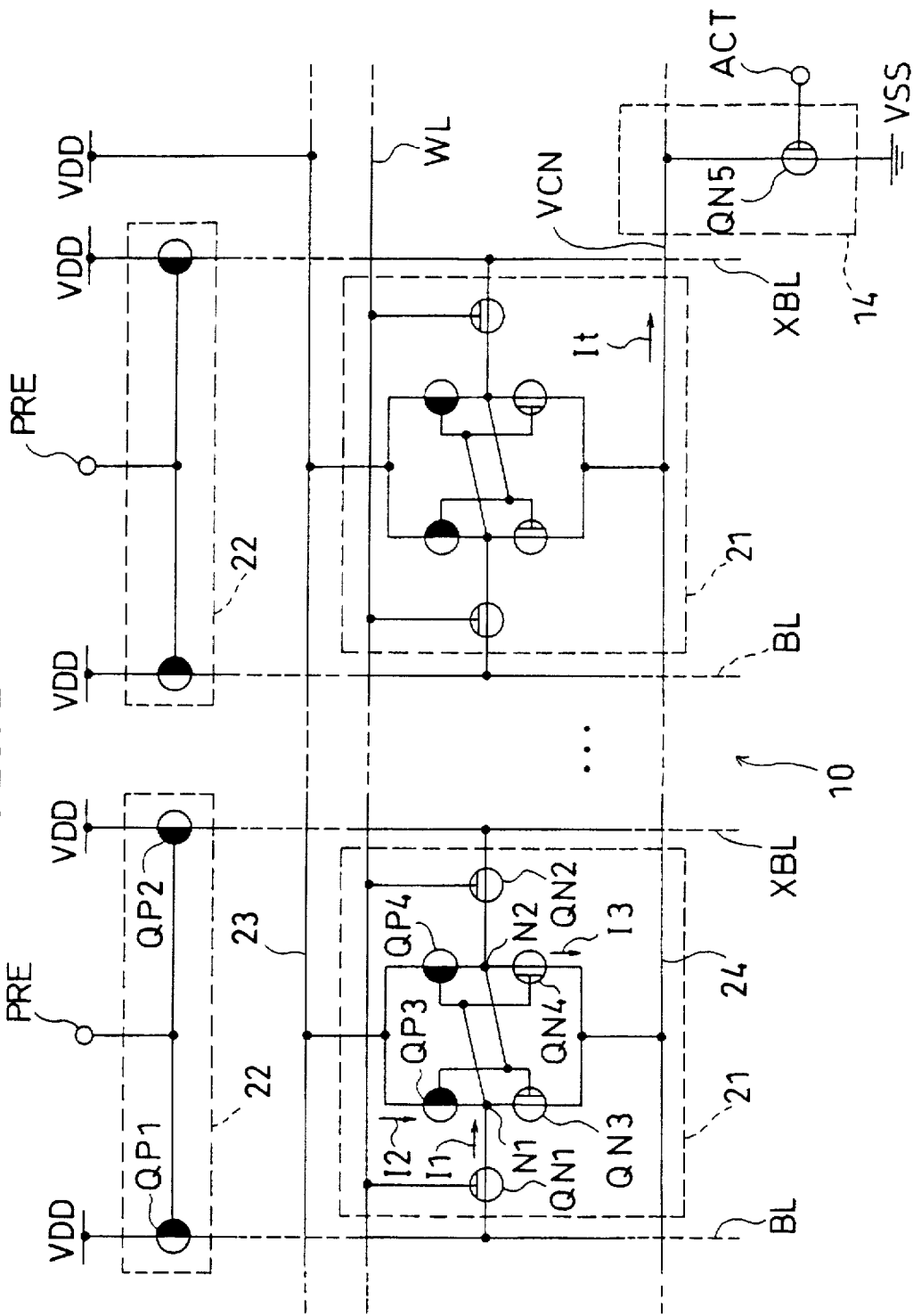
FIG. 2 depicts the internal configurations of a part of a memory cell array and a voltage controller of FIG. 1.

FIG. 2 shows the internal configuration of a part of the memory cell array 10 and the internal configuration of the voltage controller 14. As shown in FIG. 2, a single wordline WL is connected to n memory cells 21, and each of the n memory cells 21 is coupled to a bitline pair (BL, XBL). Each bitline pair is connected to a power supply VDD through PMOS transistors QP1 and QP2. These two PMOS transistors QP1 and QP2 together constitute a precharge circuit 22. The PMOS transistors QPI and QP2 receive a precharge signal PRE at their respective gates. Each of the memory cells 21 is composed of two PMOS transistors QP3 and QP4 and four NMOS transistors QN1, QN2, QN3 and QN4. Of these transistors, the two PMOS transistors QP3, QP4 and the two NMOS transistors QN3, QN4 are connected together in such a way as to form a single flip-flop. N1 and N2 of FIG. 2 indicate a first and second memory nodes of the flip-flop, respectively. The first memory node N1 is coupled, via the NMOS transistor QN1, to the bitline BL and the second memory node N2 is coupled, via the NMOS transistor QN2, to the bitline XBL. The gates of the NMOS transistors QN1 and QN2 are coupled to the wordline WL. The sources of the PMOS transistors QP3 and QP4 are coupled to a positive voltage power supply line 23. The sources of the NMOS transistors QN3 and QN4 are coupled to a ground power supply line 24. The positive voltage power supply line 23, which is coupled to each of the memory cells 21, is direct-coupled to the power supply VDD whose voltage is positive. The ground power supply line 24, which is connected to each of the memory cells 21, is connected, via an NMOS transistor QN5, to a power supply VSS whose voltage is zero (the ground voltage). The NMOS transistor QN5 is a transistor that forms the voltage controller 14. The gate of the NMOS transistor QN5 is fed the activation signal ACT. The voltage of the ground power supply line 24 is the cell power supply line voltage VCN under control of the voltage controller 14.

In accordance with the configuration of FIG. 2, when the activation signal ACT is in the state of HIGH, the NMOS transistor QN5 turns on and the ground power supply line 24 is coupled to the power supply VSS. On the other hand, when the activation signal ACT is in the state of LOW, the NMOS transistor QN5 turns off and the ground power supply line 24 is disconnected from the power supply VSS. At the standby time of the SRAM chip in which the chip select signal CS (FIG. 1) is held LOW, the activation signal ACT is intermittently made LOW. As a result, the ground power supply line 24 intermittently enters the floating state. Additionally, at the SRAM chip's standby time, the precharge signal PRE is held LOW so that the PMOS transistors QP1 and QP2 remain in the on state. As a result, the bitlines BL and XBL are precharged to HIGH. Further, at the SRAM chip's standby time, the wordline WL is held LOW and the NMOS transistors QN1 and QN2 remain in the off state. Therefore, each of the memory cells 21 holds at the first and second memory nodes N1 and N2 complementary voltages representing data of one bit. For example, suppose that the first memory node N1 is LOW (in other word the node N1 holds the voltage of the power supply VSS) and that the second memory node N2 is HIGH (in other words the node N2 holds the voltage of the power supply VDD). In such a situation, the states of the four transistors QP3, QN3, QP4 and QN4 are "off", "on", "on" and "off", respectively.

As described above, when the SRAM chip stands by, four transistors of each of the memory cells 21 (QN1, QN2, QP3, QN4 in the foregoing example case) remain in the off state. However, off-leakage current flows in three of these four transistors (QN1, QP3 and QN4 in the example case). With reference to FIG. 2, off-leakage currents flowing through the channels of the transistors QN1, QP3 and QN4 are represented by I1, I2 and I3, respectively. The source of these off-leakage currents I1-I3 is the power supply VDD and the currents I1-I3 are a major reason of why electric power is consumed when the SRAM chip is on standby. The total amount of off-leakage current of the n memory cells 21, i.e., It, is n×(I1+I2+I3).

When the NMOS transistor QN5 forming the voltage controller 14 is in the off state, a floating capacitance, which is attached to the ground power supply line 24, is charged by It=n×(I1+I2+I3). As a result, VCN gradually increases from VSS (0 V). Suppose here that the off-leakage current of the NMOS transistor QN5 is small enough to be negligible in relation to the current total amount It.

Figure 3:
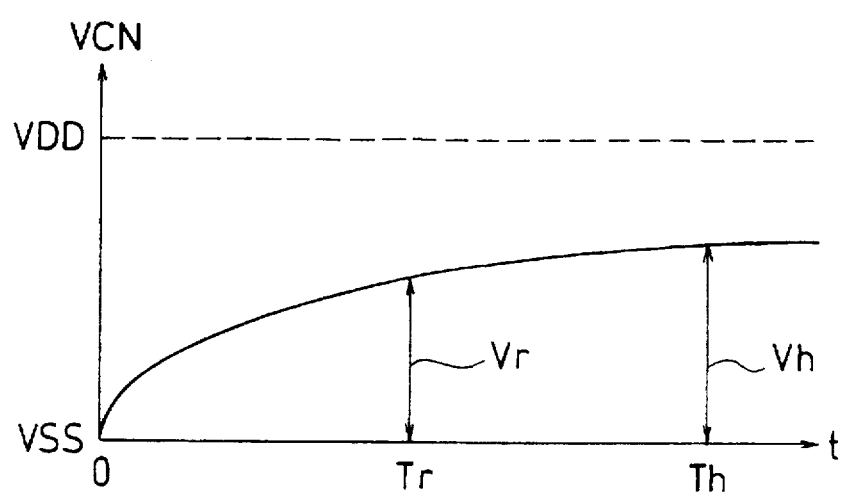
FIG. 3 graphically shows variations in cell power supply line voltage with time when a transistor, which forms the voltage controller of FIG. 2, keeps remaining in the off state.

FIG. 3 shows variations in VCN with time when the NMOS transistor QN5 keeps remaining in the off state. The NMOS transistor QN5 makes a state transition at time 0 from the on to the off state and VCN gradually increases from VSS (0 V) towards VDD. Note that due to the increase in VCN the off-leakage currents I1, I2 and I3 are decreased. Therefore, the increase amount of VCN per unit time keeps decreasing. The reason of why the off-leakage current I1 of the NMOS transistor QN1 is decreased is explained as follows. With the increase in VCN, the hold voltage of the first memory node N1, i.e., the source voltage of the NMOS transistor QN1, gradually rises from LOW. As a result, the gate-source voltage of the NMOS transistor QN1 becomes negative and the drain-source voltage thereof is decreased and I1 decreases. Additionally, the substrate of the SRAM chip is fixed at the voltage of the power supply VSS and, as a result of such arrangement, if the source voltage of the NMOS transistor QN1 is increased from LOW (i.e., from the voltage of the power supply VSS), this is equivalent to the application of a negative bias voltage to the SRAM chip substrate with respect to the source of the NMOS transistor QN1. The off-leakage current of the NMOS transistor QN1 is further decreased by so-called substrate bias effects. The reason of why the off-leakage current I2 of the PMOS transistor QP3 is decreased that, with the increase in VCN, the hold voltage of the first memory node N1, i.e., the drain voltage of the PMOS transistor QP3, is gradually increased from LOW so that the absolute value of the drain-source voltage of the PMOS transistor QP3 becomes low. The reason of why the off-leakage current I3 of the NMOS transistor QN4 is decreased is that, with the increase in VCN, the source voltage of the NMOS transistor QN4 gradually rises so that the drain-source voltage of the NMOS transistor QN4 becomes low. When the source voltage of the NMOS transistor QN4 is increased, this is equivalent to the application of a negative bias voltage to the SRAM chip substrate with respect to the source of the NMOS transistor QN4, and I3 is further decreased by the substrate bias effect. As described above, all the off-leakage currents I1, I2 and I3 are reduced with increasing VCN. The threshold voltage of the NMOS transistor QN1 may be reduced for speeding up the operation of the memory cell 21. Generally, the off-leakage current of MOS transistors that have a low threshold voltage is great. However, the off-leakage current I1 of the NMOS transistor QN1 is considerably reduced if the gate-source voltage of the NMOS transistor QN1 becomes negative when VCN increases. Therefore, it does not matter if the threshold voltage of the NMOS transistor QN1 is reduced. The same can be applied to the NMOS transistor QN2.

As shown in FIG. 3, if the NMOS transistor QN5 keeps remaining in the off state, VCN reaches a first limit voltage Vr at time Tr and then reaches a second limit voltage Vh at time Th where Vh>Vr. Whereas the second memory node N2 is held HIGH, the hold voltage of the first memory node N1 is gradually increased from LOW with the increase in VCN as previously described. When the hold voltage of the first memory node N1 exceeds the first limit voltage Vr, it becomes impossible to read data stored in the memory cell 21 in a predetermined period of time. When the hold voltage of the first memory node N1 exceeds the second limit voltage Vh, the data, stored in the memory cell 21, can no longer be read out, which means the disappearance of the data. To cope with this problem, a period, during which the activation signal ACT is in the HIGH level, is provided so that the NMOS transistor QN5 turns on every time VCN reaches either Vr or vh when the SRAM chip stands by. In other words, the activation signal ACT is intermittently made LOW at the SRAM chip's standby time.

Figure 4:
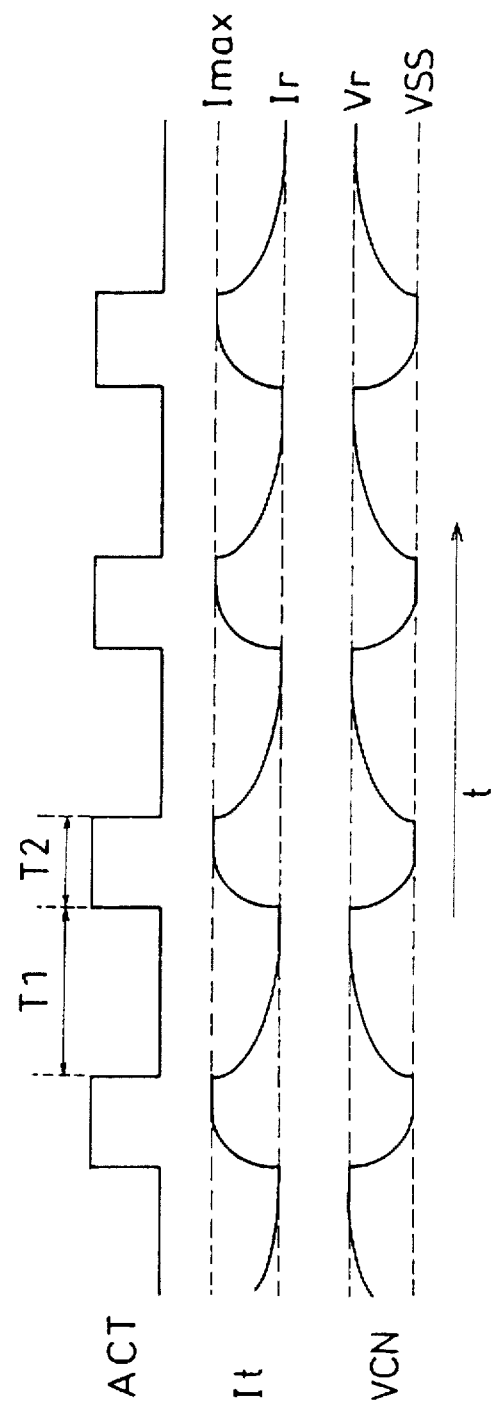
FIG. 4 is a timing diagram showing an example of the operation of the FIG. 1 semiconductor memory at standby time.

With reference to FIG. 4, an example of the standby-time operation of the SRAM chip of FIG. 1 is explained in which the first limit voltage Vr is used as a reference voltage. The NMOS transistor QN5 is in the off state, since the activation signal ACT is LOW in period T1 (FIG. 4). Therefore, the cell power supply line voltage VCN increases from the voltage of the power supply VSS (0 V) and the off-leakage current total amount It drops from the maximum current amount Imax. At the end of period T1, VCN reaches Vr and the total amount It reaches a current amount Ir corresponding to Vr. From this point, period T2 begins and the activation signal ACT is made HIGH thereby causing the NMOS transistor QN5 to turn on. As a result, VCN is brought back to the voltage of VSS and the total amount It is brought back to Imax. Thereafter, period T1 and period T2 are repeated. Although the total amount It is always at Imax if the NMOS transistor QN5 keeps turning on, the total amount It is reduced in period T1 (see FIG. 4), whereby the standby-time power consumption of the SRAM chip is reduced.

Figure 5:
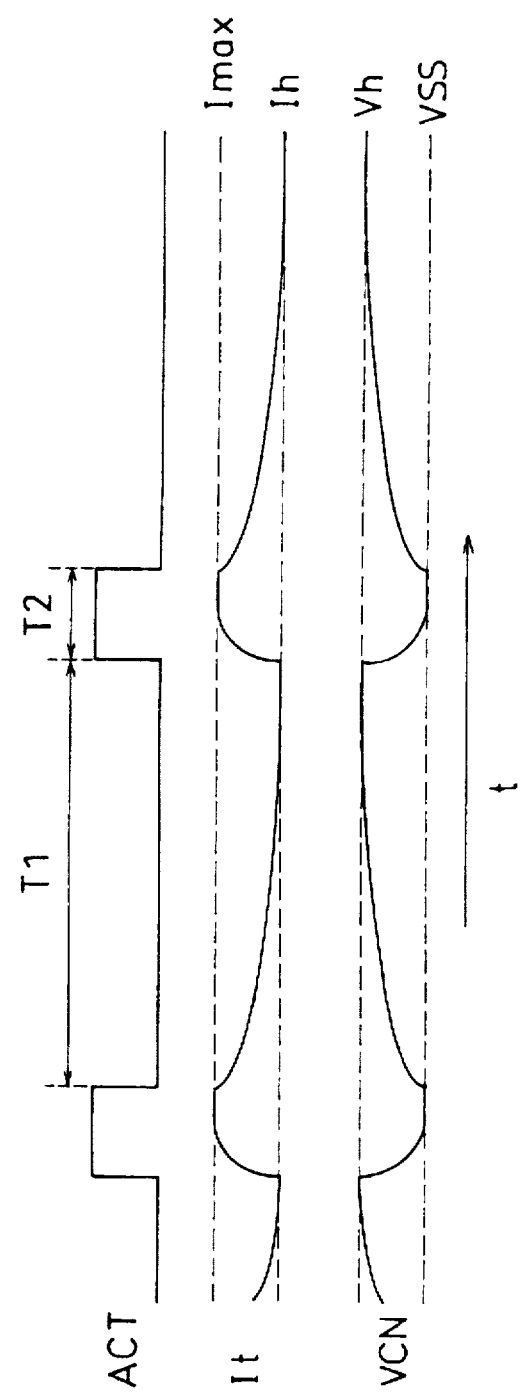
FIG. 5 is a timing diagram showing another example of the operation of the FIG. 1 semiconductor memory at standby time.

With reference to FIG. 5, an example of the standby-time operation of the SRAM chip of FIG. 1 is explained in which the second limit voltage Vh is used as a reference voltage. The NMOS transistor QN5 is in the off state, since the activation signal ACT is LOW in period T1 (FIG. 5). Therefore, VCN increases from the voltage of VSS (0 V) and the total amount It drops from Imax. At the end of period T1, VCN reaches Vh that is higher than Vr and the total amount It reaches a current amount Ih corresponding to Vh. From this point, period T2 begins and the activation signal ACT is made HIGH thereby causing the NMOS transistor QN5 to turn on. As a result, VCN is brought back to the voltage of VSS and the total amount It is brought back to Imax. Thereafter, period T1 and period T2 are repeated. In comparison with the FIG. 4 example case, the total amount It is reduced for a longer period of time, and the standby-time power consumption of the SRAM chip is further reduced. In cases where the chip select signal CS is fixed at LOW, even during a period in which the SRAM chip is in the standby state, as in the battery backup time and where it is known in advance that the read/write operation of the memory cell 21 will not be executed shortly, the FIG. 5 operation referring to the second limit voltage Vh suits. On the other hand, when the read/write operation of the memory cell 21 is required to begin in instant response to a variation in the chip select signal CS, the FIG. 4 operation referring to the first limit voltage Vr suits. It is preferable to distinguish between the use of the FIG. 4 operation and the use of the FIG. 5 operation depending on the case.

It is preferred to keep the cycle of the activation signal ACT, i.e., the sum of the length of period T1 and the length of period T2, constant. When taking into account manufacturing variations in the threshold voltage of individual transistors each forming a memory cell 21 (FIG. 2) and variations due to temperature, it is known that Imax (the maximum value of the off-leakage current total amount It) varies. When Imax is great, VCN rapidly increases from the voltage of VSS (0 V) in period T1, as a result of which It (the off-leakage current total amount) rapidly drops from Imax. Conversely, when Imax is small, VCN slowly goes up from the voltage of VSS (0 V), as a result of which It (the off-leakage current total amount) slowly drops from Imax. To sum up, the average value of the off-leakage current total amount (It) is held almost constant, regardless of the magnitude of the maximum current amount (Imax).

Figure 6:
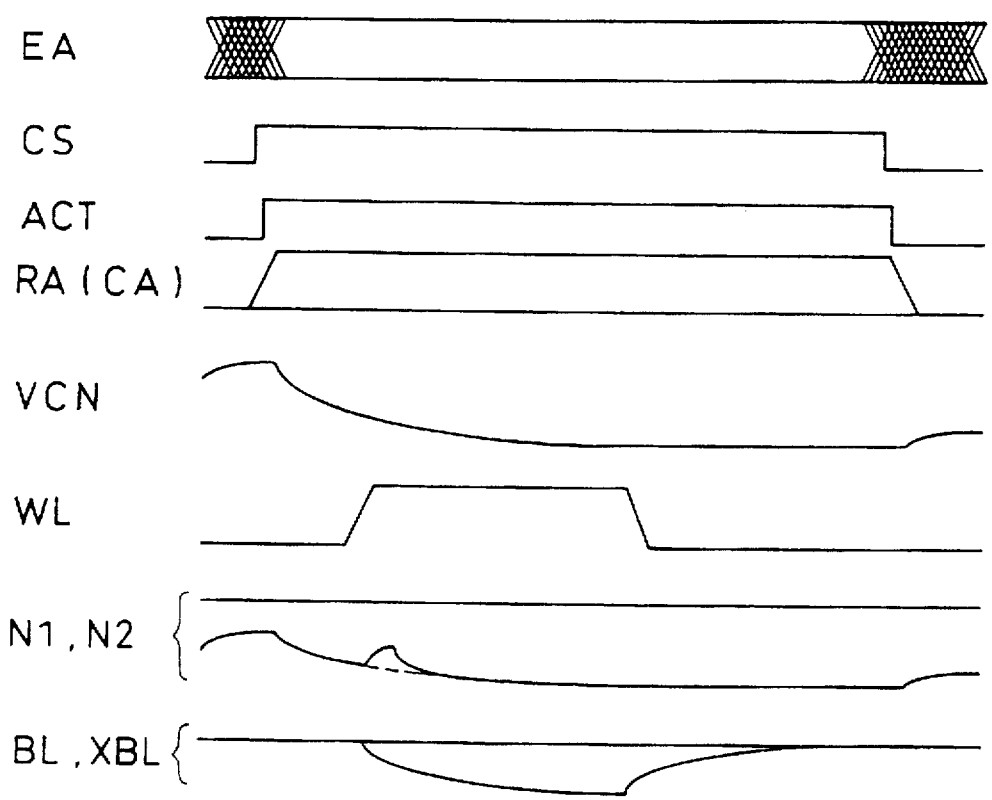
FIG. 6 is a timing diagram showing an example of the operation of the FIG. 1 semiconductor memory at read operation time.

FIG. 6 shows an example of the read sequence of the SRAM chip of FIG. 1. In synchronization with the rising of the chip select signal CS, the activation signal ACT rises and, thereafter, the voltage of the wordline WL rises (FIG. 6). The precharge signal PRE is generated based on the transition of the external address EA. When the precharge of the bitlines BL and XBL is finished, the precharge signal PRE is made HIGH.

In response to the activation signal ACT at the level of HIGH, the NMOS transistor QN5 of the voltage controller 14 turns on thereby lowering the cell power supply line voltage VCN down to the voltage of the power supply VSS. Due to VCN being decreased, the voltage of one of the first and second memory nodes N1 and N2 that undergoes a flotation of LOW level, is decreased, thereby guaranteeing that data are correctly read out from the individual memory cells 21 onto the bitlines BL and XBL. When the read processing is completed, the level of the chip select signal CS is brought back to LOW. In synchronization with the falling of the chip select signal CS, the activation signal ACT falls. As a result, the cell power supply line voltage VCN starts increasing. Also, in the case of employing standby-time operations in which the first limit voltage Vr acts as a reference voltage (FIG. 4), data can be read out correctly from each memory cell 21 onto the bitlines BL and XBL by having the activation signal ACT rise after the rise of the voltage of the wordline WL.

Figure 7:
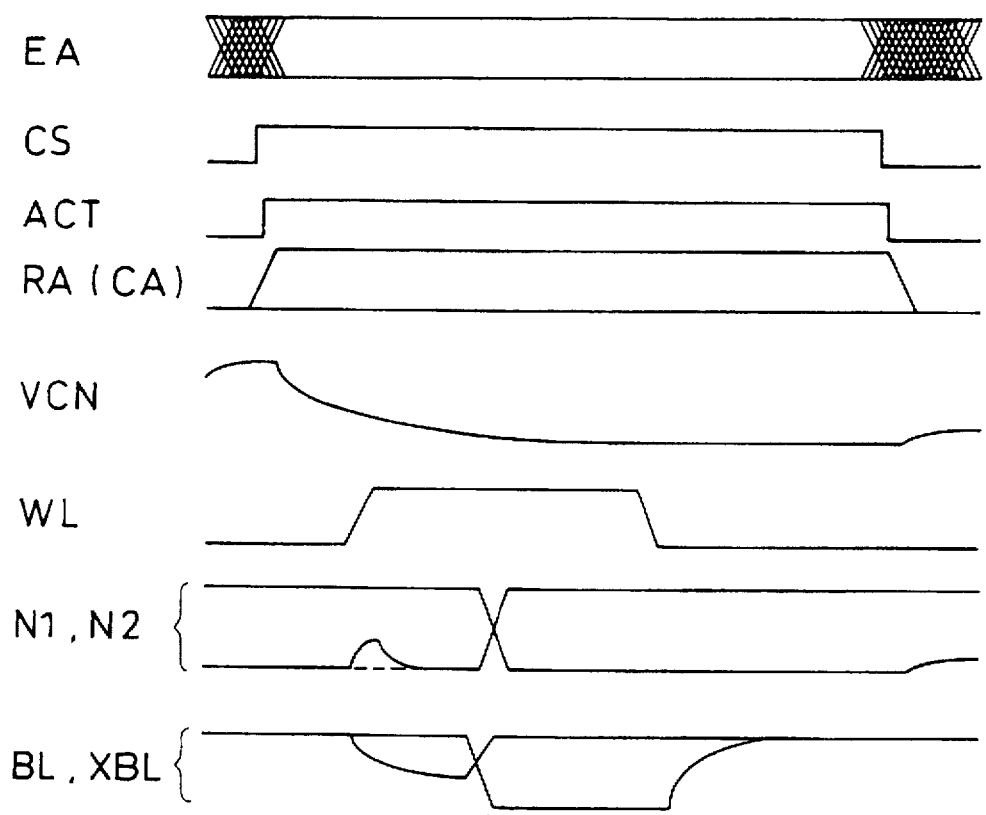
FIG. 7 is a timing diagram showing an example of the operation of the FIG. 1 semiconductor memory at write operation time.

FIG. 7 shows an example of the write sequence of the SRAM chip of FIG. 1. This write sequence is not explained here, for it is identical with the readout sequence of FIG. 6.

Four different internal configuration examples of the activation circuit 15 of FIG. 1 are now explained. Note that only circuit configuration examples for the generation of the activation signal ACT are described here. No descriptions for circuits for the generation of the internal chip select signal ICS are made.

Figure 8:
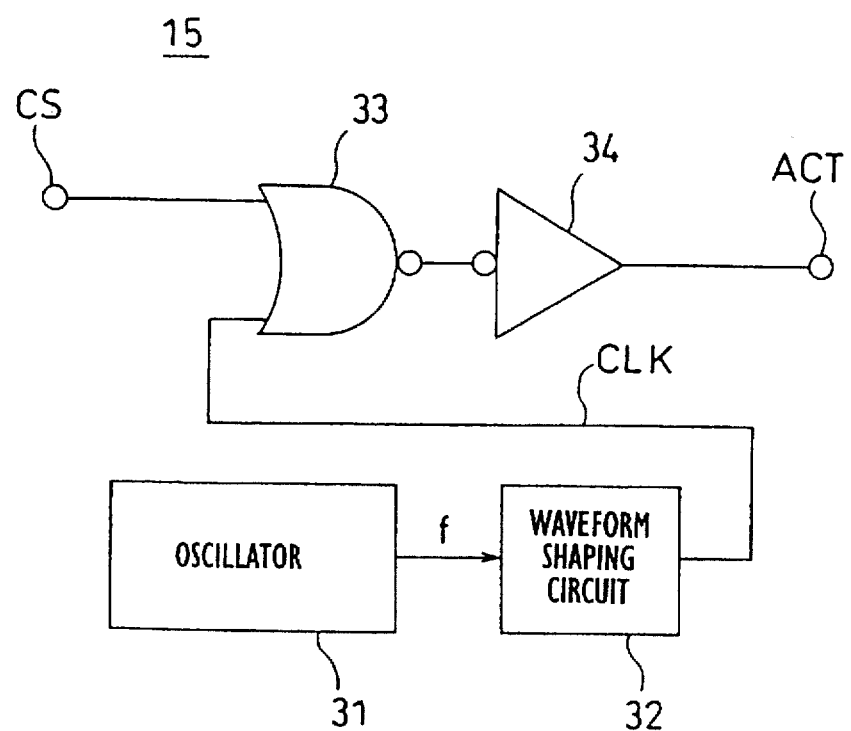
FIG. 8 is a block diagram showing an example of the internal configuration of an activation circuit of FIG. 1.

FIG. 8 shows an internal configuration of the activation circuit 15. 31 is an oscillator. 32 is a waveform shaping circuit. 33 is a NOR circuit. 34 is an inverter. The oscillator 31 is a circuit that generates, regardless of the logic level of the chip select signal CS, signals at a fixed frequency f. The waveform shaping circuit 32 is a circuit that waveform-shapes a signal generated by the oscillator 31 to produce a clock signal CLK, the frequency of which is f, for forwarding to one of input terminals (i.e., the first input terminal) of the NOR circuit 33. The chip select signal CS is supplied to the other input terminal (the second input terminal) of the NOR circuit 33. The output of the NOR circuit 33 is converted by the inverter 34 into the activation signal ACT.

In accordance with the activation circuit 15 of FIG. 8, at the standby time of the SRAM chip in which the chip select signal CS is held LOW, one of the inputs of the NOR circuit 33, i.e., the clock signal CLK at the frequency f, repeatedly makes a level-transition from HIGH to LOW, then to HIGH and so on. Accordingly, the activation signal ACT outputted from the inverter 34 intermittently becomes LOW according to the CLK's frequency f. The frequency f is determined either according to the length of periods T1 and T2 of FIG. 4 or according to the length of periods T1 and T2 of FIG. 5. When the SRAM chip is read or written, the activation signal ACT is made to rise by the NOR circuit 33 and inverter 34 in synchronization with the rising of the chip select signal CS.

Figure 9:
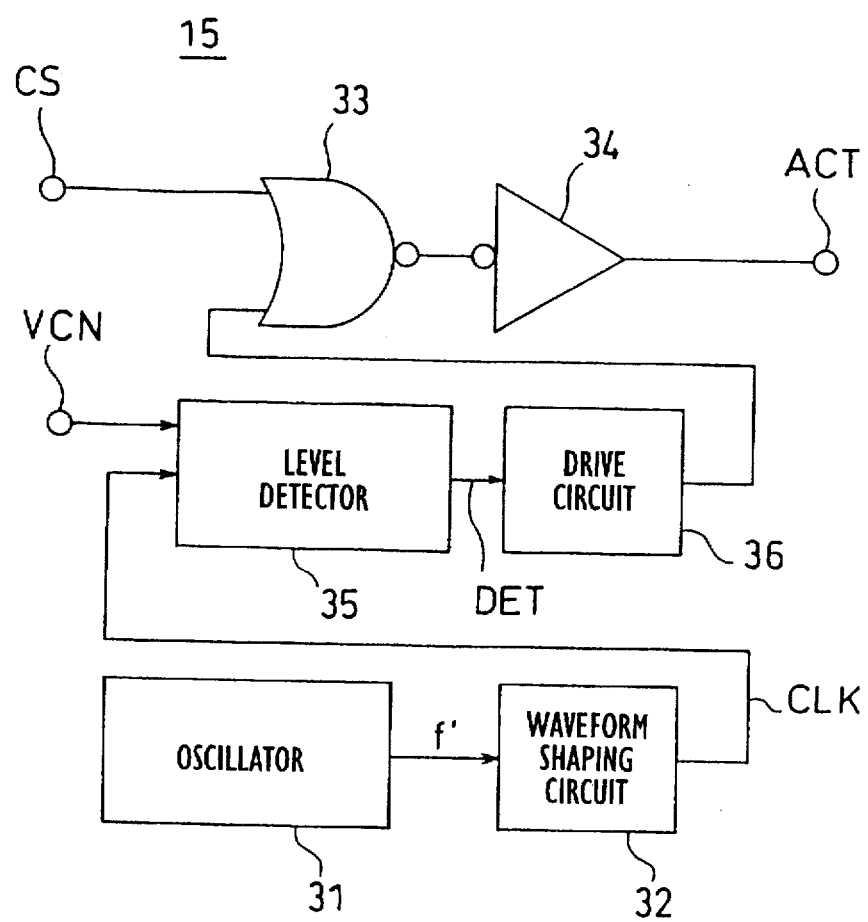
FIG. 9 is a block diagram showing another example of the internal configuration of the activation circuit of FIG. 1.

FIG. 9 shows another internal configuration of the activation circuit 15. In the activation circuit 15 of FIG. 9, a level detector 35 and a drive circuit 36 are connected between the waveform shaping circuit 32 and the first input terminal of the NOR circuit 33 of FIG. 8. The level detector 35 is a circuit that generates a LOW-active detection signal DET indicating that the cell power supply line voltage VCN reaches the first limit voltage Vr or the second limit voltage Vh. The generated detection signal DET is inverted by the drive circuit 36 for forwarding to the first input terminal of the NOR circuit 33. The clock signal CLK, which is produced by the oscillator 31 and the waveform shaping circuit 32, has a frequency of f. The level detector 35 is designed for reducing its own power consumption such that the level detector 35 determines the magnitude of the cell power supply line voltage VCN, only in a period when the level of the clock signal CLK at the frequency of f is at LOW.

Figure 10:
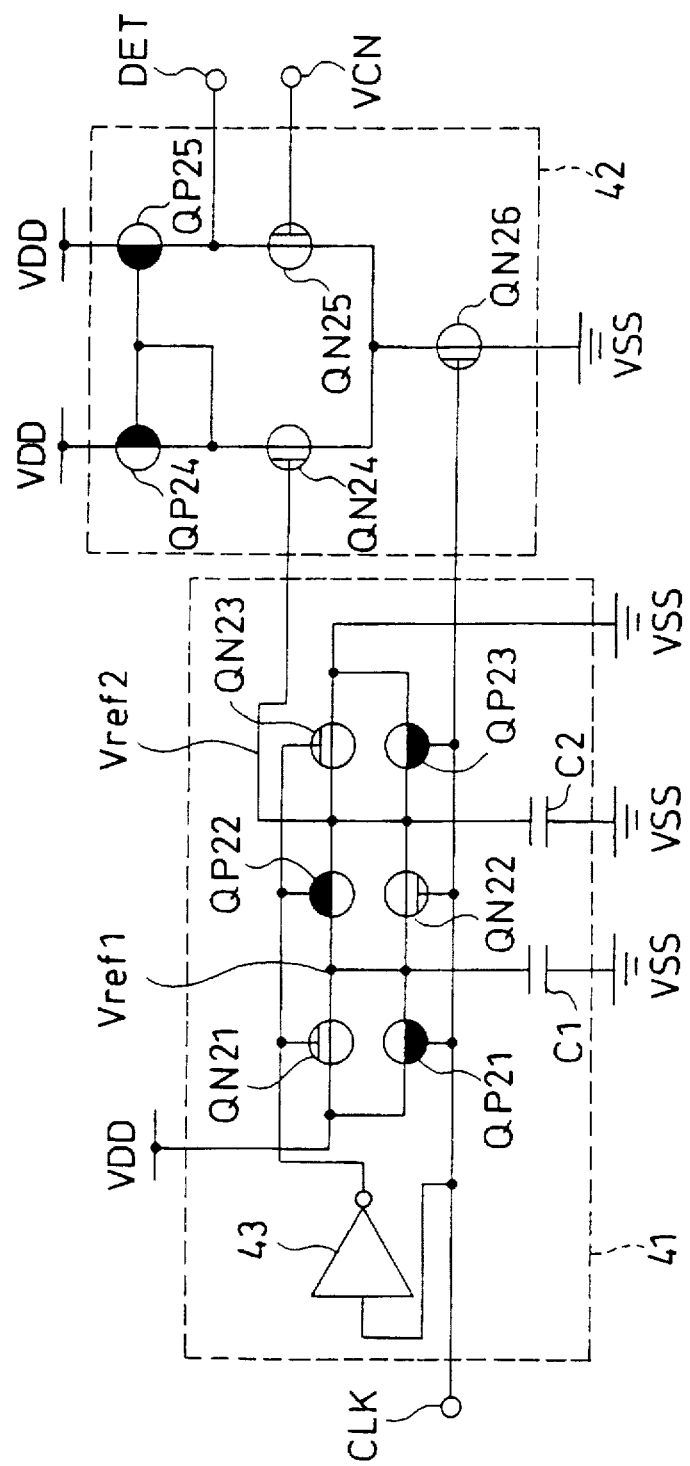
FIG. 10 is a circuit diagram showing the internal configuration of a level detector of FIG. 9.

FIG. 10 depicts the internal configuration of the level detector 35 of FIG. 9. Shown in FIG. 10 are a reference voltage generator 41 and a comparator 42. The reference voltage generator 41 is a circuit that intermittently generates a reference voltage vref2 according to the clock signal CLK at the frequency f. The comparator 42 intermittently makes a comparison between the reference voltage Vref2 and the cell power supply line voltage VCN according to the f-frequency clock signal CLK.

The reference voltage generator 41 comprises one inverter 43, three PMOS transistors QP21, QP22 and QP23, three NMOS transistors QN21, QN22 and QN23 and two capacitors C1 and C2. The transistors QP21 and QN21 together form a first switch. The transistors QP22 and QN22 together form a second switch. The transistors QP23 and QN23 together form a third switch. The first switch, composed of QP21 and QN21, is connected between the power supply VDD and the node of a reference voltage Vref1. The first switch is controlled such that it turns on when the clock signal CLK is LOW and turns off when the clock signal CLK is HIGH. The second switch, composed of QP22 and QN22, is connected between the nodes of the reference voltages Vref1 and Vref2. The second switch is controlled such that it turns off when the clock signal CLK is LOW and turns on when the clock signal CLK is HIGH. The third switch, composed of QP23 and QN23, is connected between the node of Vref2 and the power supply VSS. The third switch is controlled such that it turns on when the clock signal CLK is LOW and turns off when the clock signal CLK is HIGH. Additionally, the capacitor C1 is connected between the node of Vref1 and the power supply VSS and the capacitor C2 is connected between the node of Vref2 and the power supply VSS.

The comparator 42 comprises two PMOS transistors QP24 and QP25 and three NMOS transistors QN24, QN25 and QN26. Of these five transistors, four transistors, i.e., QP24, QP25, QN24 and QN25, are connected together in such a way as to form a conventional comparator. This conventional comparator is connected to the power supply VDD. Vref2 is applied to the gate of the NMOS transistor QN24. VCN is applied to the gate of the NMOS transistor QN25. The connection node between the PMOS transistor QP25 and the NMOS transistor QN25 is the node at which the detection signal DET is provided. The comparator 42 shown in FIG. 10 is characterized in that the NMOS transistor QN26 is connected between the connection node of the sources of the NMOS transistors QN24 and QN25 and the power supply VSS. The gate of this NMOS transistor QN26 is fed the clock signal CLK.

Figure 11:
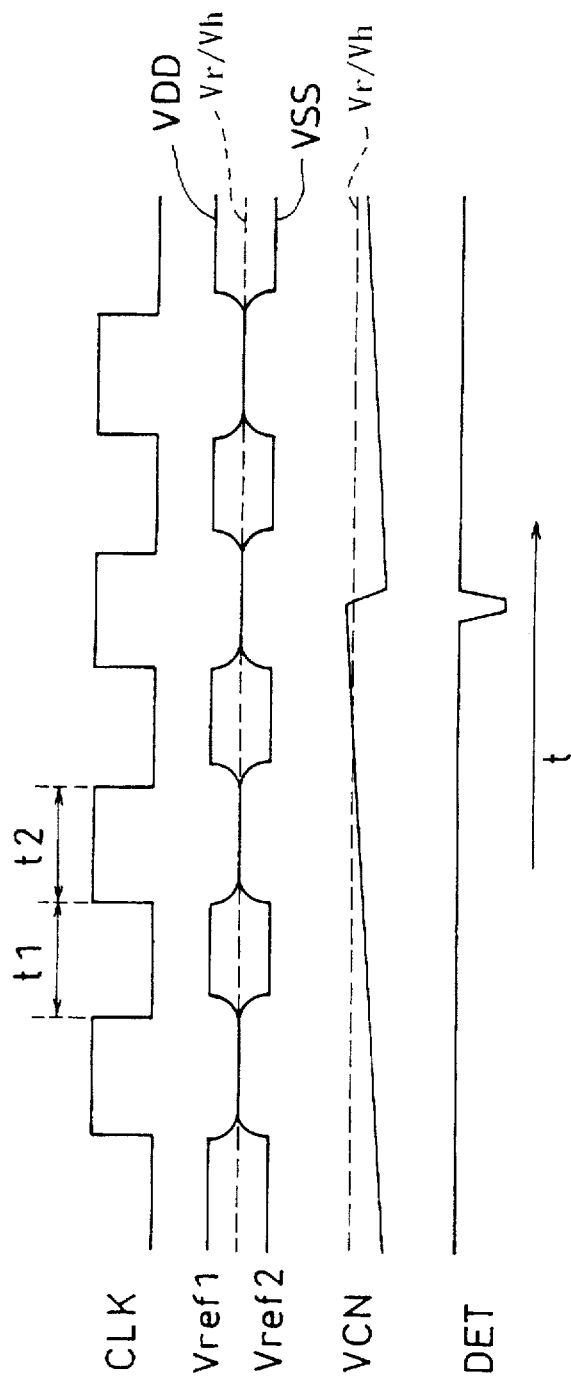
FIG. 11 is a timing diagram showing the operation of a level detector of FIG. 10.

FIG. 11 shows the operation of the level detector 35 of FIG. 10. With reference to FIG. 11, the clock signal CLK is LOW in period t1. When the clock signal CLK is LOW, (a) the first switch, composed of QP21 and QN21, turns on, (b) the second switch, composed of QP22 and QN22, turns off and (c) the third switch, composed of QP23 and QN23, turns on, in the reference voltage generator 41. As a result, the capacitor C1 is charged up to the voltage of the power supply VDD and the capacitor C2 is discharged down to the voltage of the power supply VSS (0 V), in other words the first and second reference voltages Vref1 and Vref2 of period t1 are expressed by equations of Vref1=VDD and Vref2=VSS (=0 V), respectively. The clock signal CLK is HIGH in period t2. When the clock signal CLK becomes HIGH, (a) the first switch turns off, (b)the second switch turns on and (c) the third switch turns off. Accordingly, in the period t2, charge redistribution occurs between the capacitors C1 and C2, and Vref1 and Vref2 become voltages that are expressed by:

$$Vref1=Vref2=\{1/(1+r)\}VDD$$

Here, r=C2/C1 and VSS=0 V. The electrostatic capacity ratio of the capacitor C1 and the capacitor C2, r, is set in order that the second reference voltage Vref2 agrees with the first limit voltage Vr or with the second limit voltage Vh in the period t2 (see FIG. 3). The NMOS transistor QN26 of the comparator 42 is in the off state in the period t1 and is in the on state in the period t2. Accordingly, the comparator 42 makes a comparison between VCN and Vref2, only in the period t2 thereby generating the detection signal DET of LOW level at the time when VCN reaches Vref2 (Vr or Vh).

If the reference voltage generator 41 of FIG. 10 is replaced by a conventional reference voltage generator of a resistance voltage-divide type, this causes electric current to constantly flow through the reference voltage generator from the power supply VDD towards the power supply VSS and, as a result, the reference voltage generator consumes electric power for all time. Even when the sources of the NMOS transistors QN24 and QN25 of the comparator 42 of FIG. 10 are directly coupled to the power supply VSS, an electric current constantly flows from VDD towards VSS through the comparator 42. As a result, the comparator 42 consumes electric power for all time. Conversely, in accordance with the level detector 35 of FIG. 10, the reference voltage generator 41 consumes electric power only when the capacitor C1 is charged in the period t1, and the comparator 42 consumes electric power only in the period t2. In other words, neither the reference voltage generator 41 nor the comparator 42 consumes electric power in any period other than the charge period of the capacitor C1 in the period t1. Therefore, the amount of power consumed in the level detector 35 of FIG. 10 is reduced.

Figure 12:
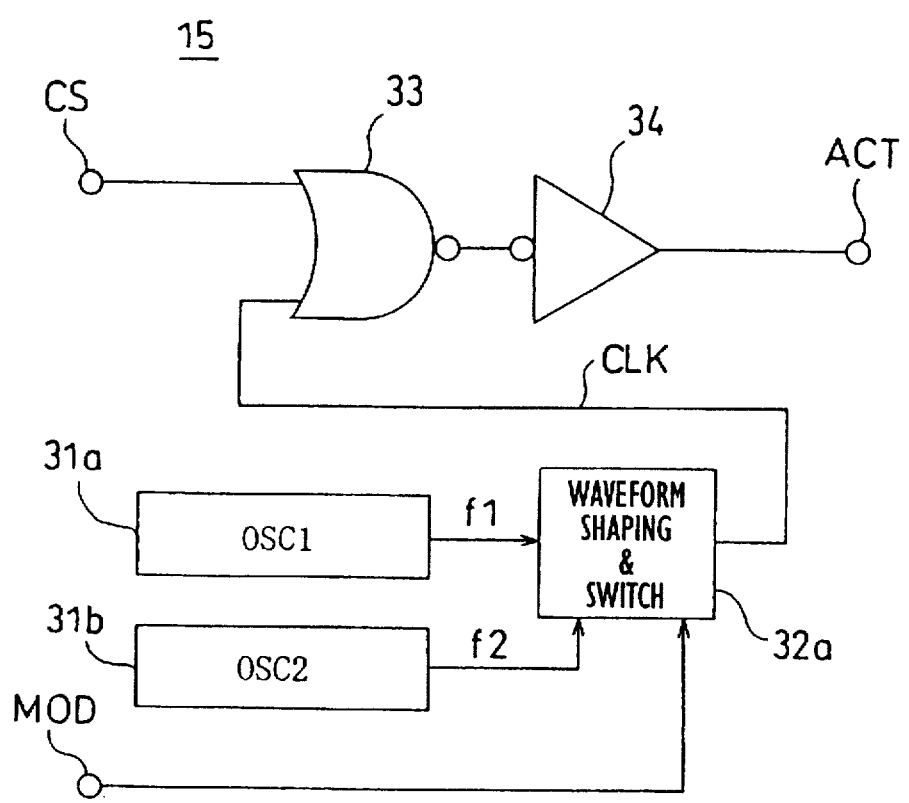
FIG. 12 is a block diagram showing still another example of the internal configuration of the activation circuit of FIG. 1.

FIG. 12 shows another internal configuration of the activation circuit 15. 31a is a first oscillator. 31b is a second oscillator. 32a is a waveform shaping/switch (WSS) circuit. 33 is a NOR circuit. 34 is an inverter. The first oscillator 31a is a circuit which generates signals that have a constant frequency f1 determined in accordance with the length of periods T1 and T2 of FIG. 4. The second oscillator 31b is a circuit which generates signals that have a constant frequency f2 determined in accordance with the length of periods T1 and T2 of FIG. 5. The WSS circuit 32a is a circuit which provides, according to the logic level of a mode switch signal MOD, a clock signal CLK produced by waveform-shaping either a signal at the frequency f1 generated in the first oscillator 31a or a signal at the frequency f2 generated in the second oscillator 31b, to one of the input terminals of the NOR circuit 33. The clock signal CLK thus produced has a frequency of f1 or f2. The chip select signal CS is applied to the other input terminal of the NOR circuit 33. The output of the NOR circuit 33 is converted by the inverter 34 into the activation signal ACT.

The activation circuit 15 of FIG. 12 makes it easy to distinguish between the use of standby-time operations in which the first limit voltage Vr is a reference voltage (FIG. 4) and the use of standby-time operations in which the second limit voltage Vh is a reference voltage (FIG. 5).

Figure 13:
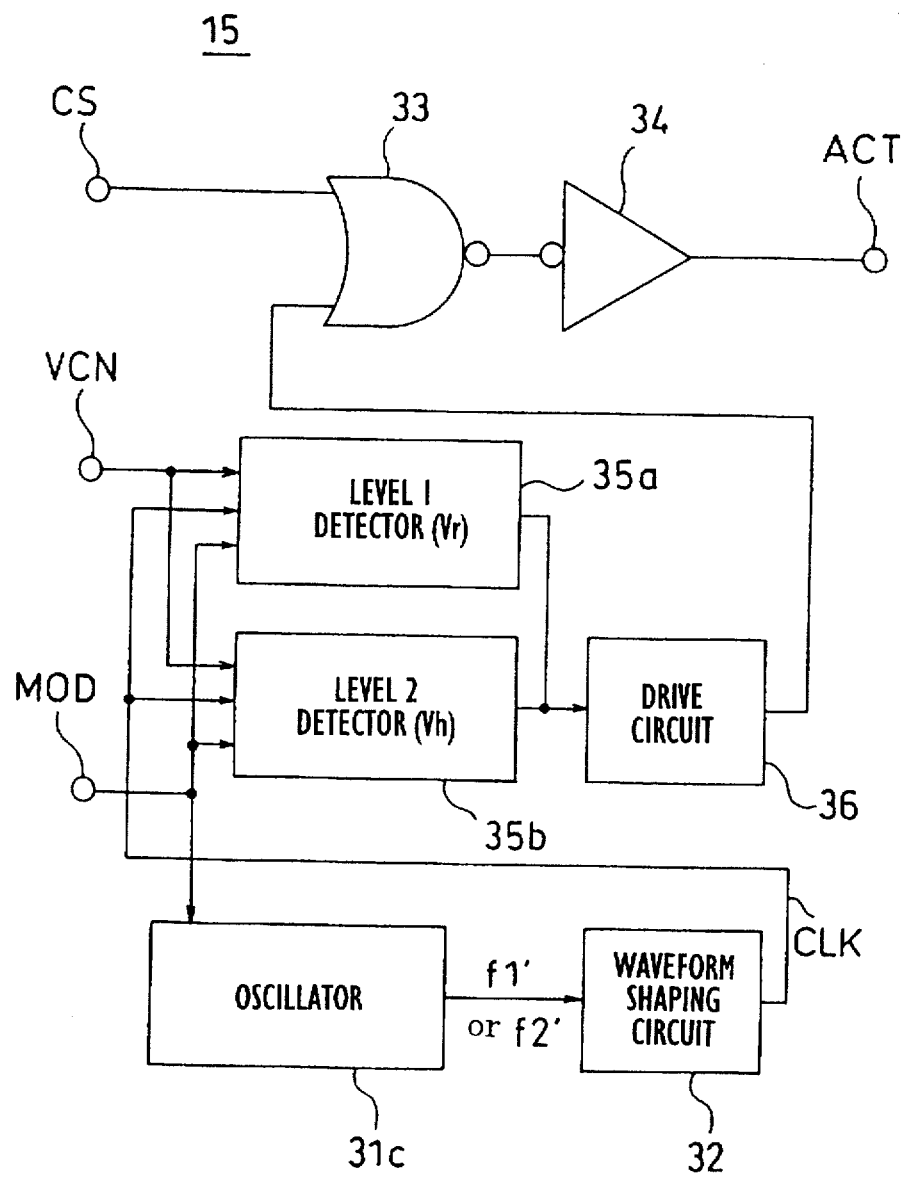
FIG. 13 is a block diagram showing a further example of the internal configuration of the activation circuit of FIG. 1.

FIG. 13 shows still another internal configuration of the activation circuit 15. 31c is an oscillator. 32 is a waveform shaping circuit. 35a is a first level detector. 35b is a second level detector. 36 is a drive circuit. 33 is a NOR circuit. 34 is an inverter. The oscillator 31c is a circuit which generates, according to the logic level of the mode switch signal MOD, signals that have a frequency of f1' or f2' (f1'>f2'). The waveform shaping circuit 32 is a circuit which provides a clock signal CLK, which is produced by waveform-shaping a signal generated in the oscillator 31c and which has a frequency of f1' or f2', to the first and second level detectors 35a and 35b. More specifically, the LOW-level period of the clock signal CLK at the frequency f2' is longer than the LOW-level period of the clock signal CLK at the frequency f1'. It is designed such that only one of the first and second level detectors 35a and 35b operates depending upon the logic level of the mode switch signal MOD. The first level detector 35a is a circuit that generates a detection signal indicating that the cell power supply line voltage VCN reaches the first limit voltage Vr, according to the f1'-frequency clock signal CLK. The second level detector 35b is a circuit that generates a detection signal indicating that VCN reaches the second limit voltage vh, according to the f2'-frequency clock signal CLK. The first and second level detectors 35a and 35b are approximately identical in configuration with the one shown in FIG. 10. The detection signal, generated in any one of the first and second level detection circuits 35a and 35b, is applied to one of the input terminals of the NOR circuit 33 via the drive circuit 36. The chip select signal CS is applied to the other input terminal of the NOR circuit 33. The output of the NOR circuit 33 is converted by the inverter 34 into the activation signal ACT.

The activation circuit 15 of FIG. 13 makes it easy to distinguish between the use of standby-time operations by means of the first level detector 35a in which the first limit voltage Vr is a reference voltage (FIG. 4) and the use of standby-time operations by means of the second level detector 35b in which the second limit voltage Vh is a reference voltage (FIG. 5). Additionally, the frequency of the clock signal CLK is modified by the oscillator 31c according to properly switching between the FIG. 4 standby-time operation and the FIG. 5 standby-time operation so that the non-power consumption period of the second level detector 35b is made longer than that of the first level detector 35a. Further, the oscillator 31c may be constructed such that it generates signals that have a constant frequency, regardless of the logic level of the mode switch signal MOD.

Figure 14:
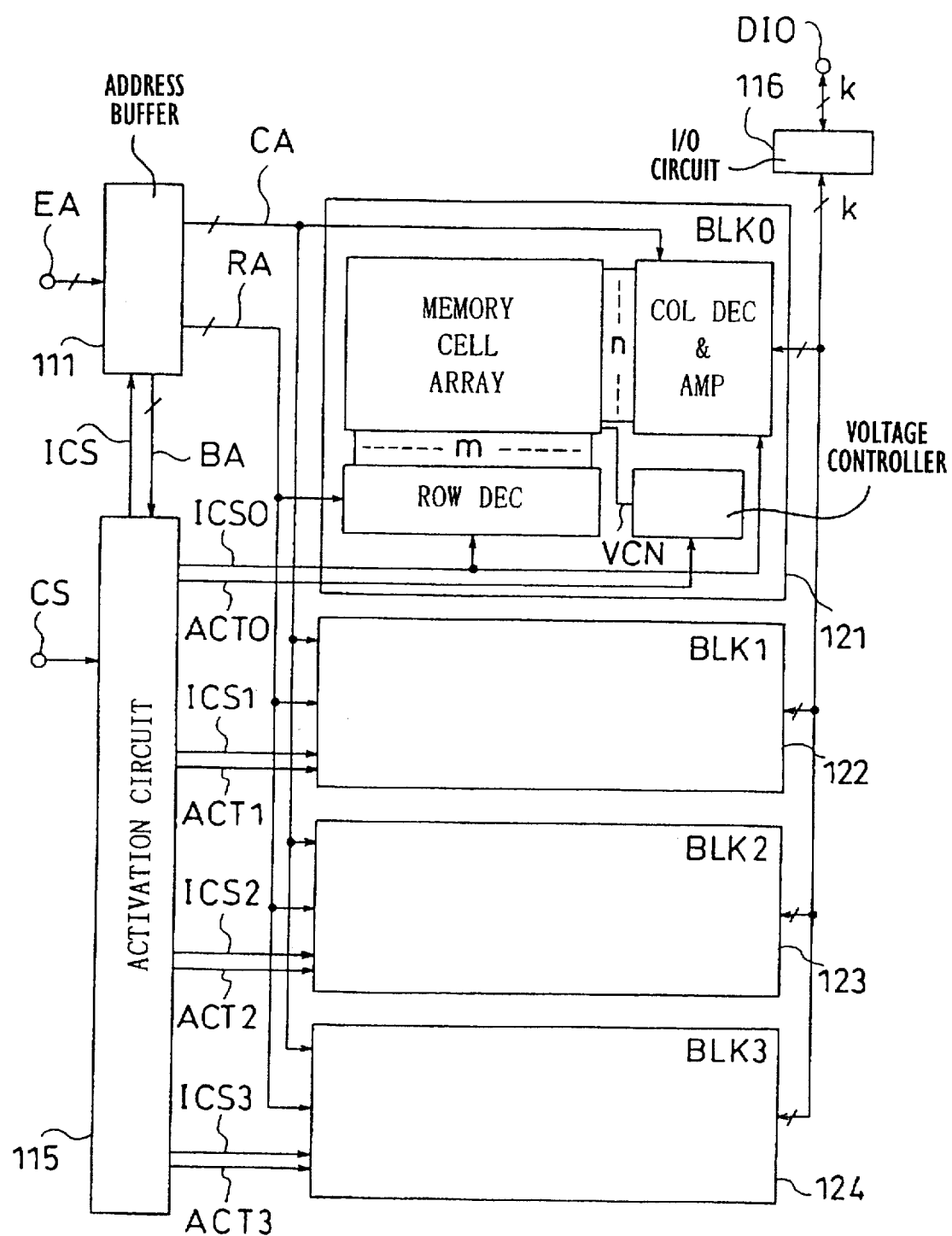
FIG. 14 is a block diagram showing the internal configuration of a semiconductor memory in accordance with another embodiment of the present invention.

Instead of intermittently bringing the ground power supply line 24 of FIG. 2 into the state of floating at standby time, an element having a predetermined impedance may be connected between the line 24 and the power supply VSS. Such an impedance element has a function of having the rising amount of VCN fall within a predetermined range. FIG. 14 shows an SRAM chip in accordance with another embodiment of the present invention. The SRAM chip of FIG. 14 has four blocks (BLK0–BLK3) 121, 122, 123 and 124, an address buffer 111, an activation circuit 115 and an input/output (I/O) circuit 116. Each block 121–124 has a memory cell array, a row decoder, a column decoder/amplifier (including a sense amplifier and a write amplifier) and a voltage controller formed of an NMOS transistor for controlling the cell power supply line voltage VCN (see FIG. 2). The address buffer 111 receives an external address EA, provides a row address RA and a column addresses CA to each block 121–124 and provides a block address BA of two bits to the activation circuit 115. The I/O circuit 116 is arranged between the four blocks 121–124 and the data terminal DIO. The activation circuit 115 receives the chip select signal CS and the block address BA, generates an internal chip select signal ICS for the activation of the address buffer 111, generates internal chip select signals ICS0–ICS3 for the activation of the row decoders and column decoders/amplifiers of the four blocks 121–124 and generates activation signals ACT0–ACT3 for controlling the operation of the voltage controllers of the four blocks 121–124.

Figure 15:
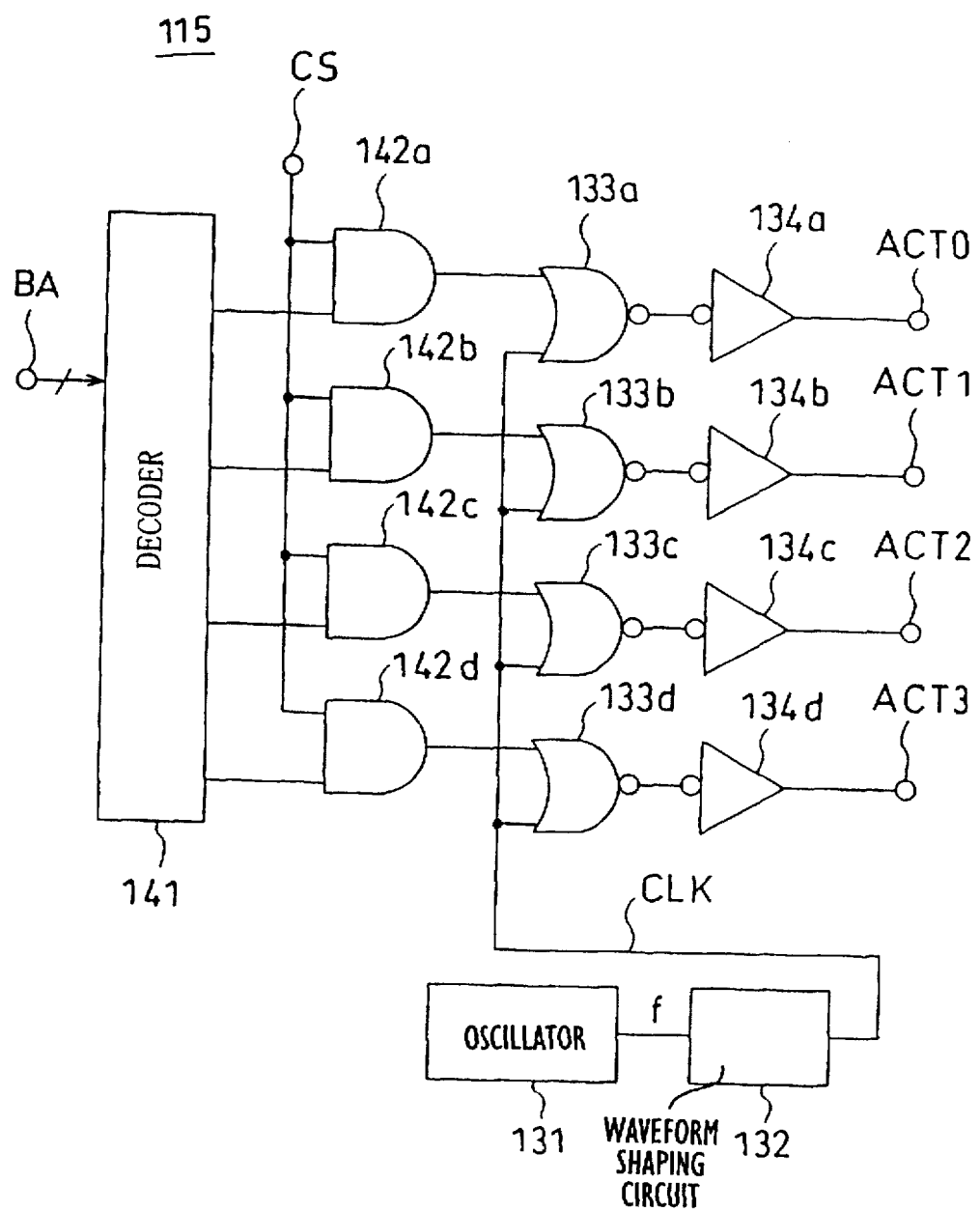
FIG. 15 is a block diagram showing an example of the internal configuration of an activation circuit of FIG. 14.

FIG. 15 shows an internal configuration of the activation circuit 115 of FIG. 14. Note that only a circuit configuration example for the generation of the activation signals ACT0–ACT3 is described and no descriptions are made here for circuit configurations for the generation of the internal chip select signals ICS and ICS0–ICS3. 131 is an oscillator. 132 is a waveform shaping circuit. 133a–133d are NOR circuits. 134a–134d are inverters. 141 is a decoder. 142a–142d are AND circuits. The oscillator 131 is a circuit which generates signals having a constant frequency f, regardless of the logic level of the chip select signal CS. The waveform shaping circuit 132 provides a clock signal CLK, which is produced by waveform-shaping a signal generated by the oscillator 131 and which has a frequency of f, to ones of input terminals of the four NOR circuits 133a–133d. The decoder 141 receives a block address BA of two bits and decodes it. The four decode outputs from the decoder 141 are supplied to ones of input terminals of the four AND circuits 142a–142d, respectively. A chip select signal CS is fed to the others of the input terminals of the AND circuits 142a–142d. The outputs of the four AND circuits 142a–142d are supplied to the others of the input terminals of the NOR circuits 133a–133d, respectively. The outputs of the NOR circuits 133a–133d are converted by the inverters 134a–134d into the activation signals ACT0–ACT3, respectively.

At the standby time of the SRAM chip of FIG. 14, in which the chip select signal CS is held LOW, ones of inputs of the NOR circuits 133a–133d of FIG. 15, i.e., the clock signal CLK at a frequency of f, repeatedly make a transition from HIGH to LOW, then to HIGH, then to LOW and so on. Accordingly, the activation signals ACT0–ACT3 outputted from the inverters 134a–134d become LOW intermittently and simultaneously according to the frequency f of the clock signal CLK. A ground power supply line of a flip-flop forming each memory cell in each block 121–124 is intermittently brought into the floating state, as a result of which power, consumed when the SRAM chip stands by, is reduced.

At the read operation time or at the write operation time of the SRAM chip of FIG. 14, only one of the four AND circuits 142a–142d of FIG. 15 is chosen by the decoder 141 according to the block address BA. Thereafter, a HIGH-level signal in synchronization with the rising of the chip select signal CS is fed only to one of the four NOR circuits 133a–133d that corresponds to the AND circuit selected by the decoder 141. Accordingly, only one of the four activation signals ACT0–ACT3 that is selected according to the block address BA is made to rise in synchronization with the chip select signal CS. As a result, the cell power supply line voltage (VCN) of only one of the four blocks 121–124 that is actually accessed is reduced down to the voltage of VSS. In other words, the VCN of the remaining non-accessed three blocks keeps going up, therefore reducing off-leakage current for a long period of time.

Additionally, a section, formed of the oscillator 131 and the waveform shaping circuit 132 of FIG. 15, may be modified to its respective corresponding sections shown in FIGS. 9, 12 and 13.

Figure 16:
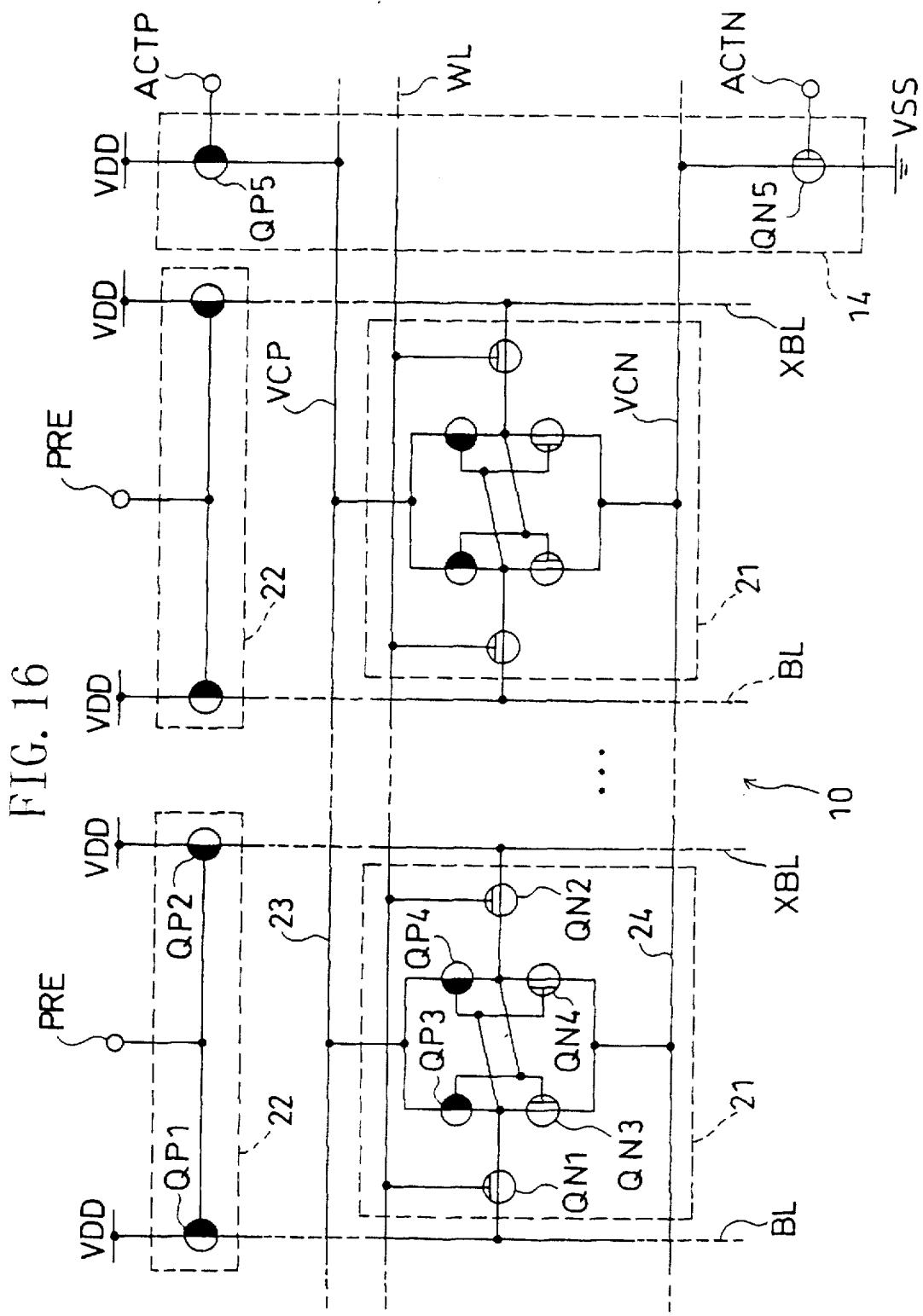
FIG. 16 is a circuit diagram showing a modification of the voltage controller of FIG. 2.

FIG. 16 shows a modification of the voltage controller 14 of FIG. 2. With reference to FIG. 16, the ground power supply line 24 of each memory cell 21 is coupled to VSS through the NMOS transistor QN5 and the positive voltage power supply line 23 of each memory cell 21 is coupled to VDD through the PMOS transistor QP5. These transistors QP5 and QN5 constitute the voltage controller 14 that controls the voltages of the lines 23 and 24, i.e., the cell power supply line voltages VCP and VCN, at the same time. A first activation signal ACTP is applied to the gate of the PMOS transistor QP5, while a second activation signal ACTN is applied to the gate of the NMOS transistor QN5.

In accordance with the configuration shown in FIG. 16, when the SRAM chip stands by, the first and second activation signals ACTP and ACTN are intermittently made HIGH and LOW, respectively and, as a result, both the positive voltage power supply line 23 and the ground power supply line 24 intermittently enter the floating state. Because of this, the substrate bias effect is produced also in the PMOS transistor QP3 or QP4 of each memory cell 21. Not only the off-leakage current in each memory cell 21 but also the standby-time power consumption of the SRAM chip is further reduced in comparison with the FIG. 2 case. It is possible that the provision of the NMOS transistor QN5 of FIG. 16 is omitted and the ground power supply line 24 is coupled directly to the power supply VSS.

As can be seen from the foregoing description, the off-leakage current of a transistor forming each memory cell's 21 flip-flop is reduced by means of the devised circuit configurations of the foregoing embodiments of the present invention and the reduction of standby-time power consumption in the SRAM chip is achieved. Since the transistor off-leakage current is reduced, this makes it possible to decrease the transistor threshold voltage. Fast, low-power SRAM chips can be realized easily, in other words high-speed SRAMs driven by batteries in portable equipment can be provided.

In an example of the standby-time operation of the SRAM chip (FIG. 4), VCN is brought back to the voltage of VSS (0 V) every time VCN reaches Vr. Instead, VCN may be brought back to a certain power supply voltage of positive between Vr and VSS. As a result of such arrangement, not only the off-leakage current of each memory cell but also the standby-time power consumption by the SRAM chip is further reduced in relation to the above-noted case, which is the same as in the FIG. 5 standby-time operation example in which the second limit voltage vh is used as a reference voltage.

The above-described embodiments of the present invention are applications to SRAM chips. It is to be noted that the present invention is applicable not only to independent memory chips but also to embedded memories such as memory cores built in microprocessors.

Figure 17:
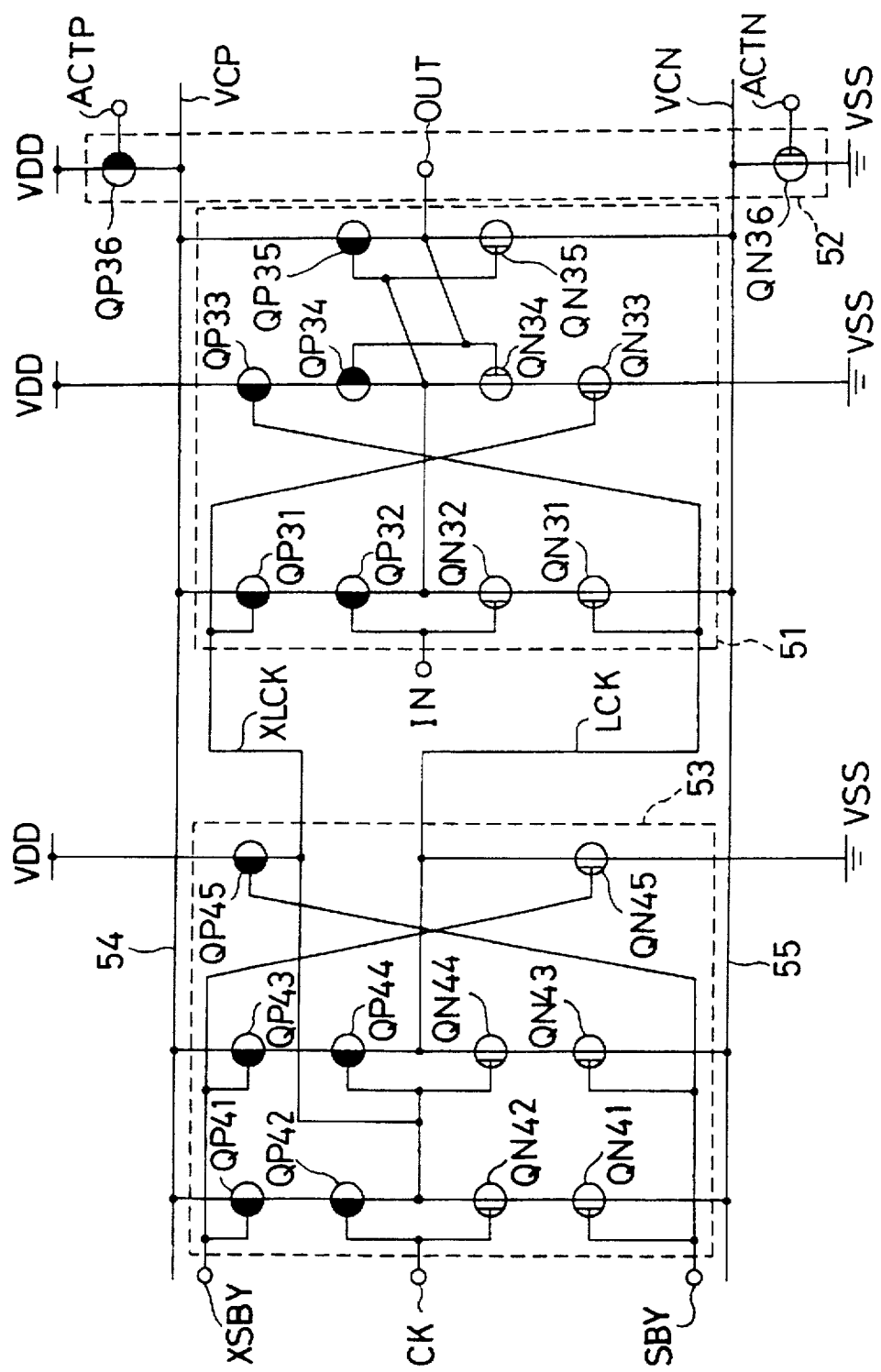
FIG. 17 is a circuit diagram illustrating the configuration of a latch circuit in accordance with still another embodiment of the present invention.

FIG. 17 shows an application example of the present invention to a latch circuit in a semiconductor integrated circuit. A latch circuit, shown in FIG. 17, has a latch cell 51 for holding data, a voltage controller 52 for controlling VCP and VCN (the cell power supply line voltages) and an internal clock generator 53 for generating complementary clock signals LCK and XLCK. Shared between the latch cell 51 and the internal clock generator 53 are a positive voltage power supply line 54 and a ground power supply line 55. The positive voltage power supply line 54 is coupled, through a PMOS transistor QP36, to the power supply VDD whose voltage is positive. The ground power supply line 55 is coupled, through an NMOS transistor QN36, to the power supply VSS whose voltage is the ground voltage, 0 V. These transistors QP36 and QN36 constitute the voltage controller 52 that controls the voltages of the lines 54 and 55, i.e., the cell power supply line voltages VCP and VCN, at the same time. The first activation signal ACTP is applied to the gate of the PMOS transistor QP36, while the second activation signal ACTN is applied to the gate of the NMOS transistor QN36.

The latch cell 51 is formed of five PMOS transistors and five NMOS transistors, namely PMOS transistors QP31–QP35 and NMOS transistors QN31–QN35. A serial circuit is formed by the two PMOS transistors QP31 and QP32 and the two NMOS transistors QN32 and QN31. This serial circuit is connected between the positive voltage power supply line 54 and the ground power supply line 55. An input signal IN is applied to the gates of the transistors QP32 and QN32 together forming a single inverter. The internal clock signal XLCK is applied to the gate of the PMOS transistor QP31. The internal clock signal LCK is applied to the gate of the NMOS transistor QN31. A serial circuit is formed by the two PMOS transistors QP33 and QP34 and the two NMOS transistors QN34 and QN33. This serial circuit is connected between VDD and VSS. The output of the inverter formed of the transistors QP32 and QN32 is fed to a connection between the transistors QP34 and QN34. The internal clock signal LCK is applied to the gate of the PMOS transistor QP33. The internal clock signal XLCK is applied to the gate of the NMOS transistor QN33. A serial circuit is formed by the PMOS transistor QP35 and the NMOS transistor QN35. This serial circuit is connected between the positive voltage power supply line 54 and the ground power supply line 55. The two PMOS transistors QP34 and QP35 and the two NMOS transistors QN34 and QN35 are connected together in such a way as to form a single flip-flop. An output signal OUT, which is the output of the latch cell 51, is provided at a connection between the PMOS transistor QP35 and the NMOS transistor QN35.

The internal clock generator 53 is a circuit formed of five PMOS transistors and five NMOS transistors, namely PMOS transistors QP41–QP45 and NMOS transistors QN41–QN45.

The internal clock generator 53 receives an external clock signal CK and complementary standby signals SBY and XSBY. A serial circuit is formed of the two PMOS transistors QP41 and QP42 and the two NMOS transistors QN42 and QN41. This serial circuit is connected between the positive voltage power supply line 54 and the ground power supply line 55. The transistors QP42 and QN42 together form a first inverter for the supply of the internal clock signal XLCK. The external clock signal CK is applied to the gates of the transistors QP42 and QN42. The standby signal XSBY is applied to the gate of the PMOS transistor QP41. The standby signal SBY is applied to the gate of the NMOS transistor QN41. A serial circuit is formed of the two PMOS transistors QP43 and QP44 and the two NMOS transistors QN44 and QN43. This serial circuit is connected between the positive voltage power supply line 54 and the ground power supply line 55. The PMOS transistor QP44 and the NMOS transistor QN44 together form a second inverter for the supply of the internal clock signal LCK, and each of the gates of these transistors QP44 and QN44 receives the internal clock signal XLCK from the first inverter. The standby signal XSBY is applied to the gate of the PMOS transistor QP43. The standby signal SBY is applied to the gate of the NMOS transistor QN43. The PMOS transistor QP45 is connected between the power supply VDD and a signal line for the internal clock signal XLCK in order that the voltage of XLCK is fixed at the voltage of VDD when the semiconductor integrated circuit with the latch circuit of FIG. 17 stands by. The NMOS transistor QN45 is connected between a signal line for the internal clock signal LCK and the power supply VSS in order that the voltage of LCK is fixed at the voltage of VSS when the semiconductor integrated circuit stands by. The standby signal SBY is applied to the gate of the PMOS transistor QP45 and the standby signal XSBY is applied to the gate of the NMOS transistor QN45.

With reference to FIG. 17, the PMOS transistor QP34 and the NMOS transistor QN34 of the latch cell 51, the PMOS transistor QP36 and the NMOS transistor QN36 which form the voltage controller 52 and the PMOS transistor QP45 and the NMOS transistor QN45 of the internal clock generator 53 are transistors that have a high threshold voltage. The remaining transistors are ones that have a low threshold voltage.

The first and second activation signals ACTP and ACTN are set LOW and HIGH, respectively so that both the PMOS transistor QP36 and the NMOS transistor QN36, which together form the voltage controller 52, turn on at the time when the latch circuit of FIG. 17 operates. Accordingly, the positive voltage power supply line 54 is coupled to the power supply VDD and the ground power supply line 55 is coupled to the power supply VSS. Additionally, the standby signals XSBY and SBY are set LOW and HIGH, respectively so that the two PMOS transistors QP41 and QP43 and the two NMOS transistors QN41 and QN43 each turn on while the PMOS transistor QP45 and the NMOS transistor QN45 each turn off at the time when the latch circuit operates. As a result, the complementary internal clock signals LCK and XLCK in synchronization with the external clock signal CK are supplied to the latch cell 51. In this case, the threshold voltage of each of the transistors QP42, QP44, QN42 and QN44 is low so that the internal clock signals LCK and XLCK follow, at high speed, the external clock signal CK. In synchronization with the rising of the internal clock signal LCK and according to the logic level of the input signal IN, the latch cell 51 updates the logic level of the output signal OUT. In this case, the threshold voltage of each of the transistors QP31–QP33, QP35, QN31–QN33 and QN35 is low so that a delay between the rising transition of LCK and the transition of OUT is very short. None of the transistors QP34 and QN34 that have a high threshold voltage prevents the output signal OUT from being fixed at a high speed. Even when the internal clock signal LCK becomes LOW, the flip-flop, comprised of the transistors QP34, QP35, QN34 and QN35, functions to maintain the logic level of the output signal OUT.

At the standby time, the first and second activation signals ACTP and ACTN are intermittently made HIGH and LOW, respectively, therefore causing both the positive voltage power supply line 54 and the ground power supply line 55 to intermittently enter the floating state. On the other hand, at the standby time of the latch circuit, the standby signals XSBY and SBY are set HIGH and LOW, respectively so that in the internal clock generator 53 the transistors QP41, QP43, QN41 and QP43 each turn off while the transistors QP45 and QN45 each turn on. Accordingly, the voltage of the internal clock signal XLCK is fixed at the voltage of VDD and the voltage of the internal clock signal LCK is fixed at the voltage of VSS. As a result, in the latch cell 51 the transistors QP31 and QN31 remain in the off state while the transistors QP33 and QN33 remain in the on state. Suppose that the output signal OUT maintains the level of HIGH. In this cases, the states of four transistors forming the flip-flop (QP34, QN34, QP35, QN35) are "off", "on", "on" and "off", respectively. Off-leakage current at standby time must be taken into consideration for the PMOS transistors QP31, QP34, QP41 and QP43 and the NMOS transistors QN31, QN35, QN41 and QN43.

During the off period of the transistors QP36 and QN36 forming the voltage controller 52, one of the cell power supply line voltages, i.e., VCP, gradually drops from the voltage of the power supply VDD while the other cell power supply line voltage, i.e., VCN, gradually goes up from the voltage of the power supply VSS, resulting in reducing the off-leakage current of each transistor. This is explained taking the NMOS transistor QN35 with a low threshold voltage as an example. The two NMOS transistors QN33 and QN34 are in the on state and the gate voltage of the NMOS transistor QN35 is equal to the voltage of the power supply VSS. It is designed such that the gate voltage of the NMOS transistor QN35 remains unchanged even when the cell power supply line voltage (VCN) makes a change. On the other hand, the source voltage of the NMOS transistor QN35, i.e., VCN, rises from the voltage of the power supply VSS. As a result, the gate-source voltage of the NMOS transistor QN35 becomes negative and the drain-source voltage thereof decreases. Accordingly, the off-leakage current of the NMOS transistor QN35 is reduced. In the three other NMOS transistors QN31, QN41 and QN43, the same occurs. More specifically, the gate-source voltage of QN31, QN41 and QN43 becomes negative due to the floating of the cell power supply line voltage VCN and the off-leakage current is reduced. Note that the PMOS transistor QP34 is formed of one that has a high threshold voltage for the reduction of off-leakage current.

If the PMOS transistor QP36 and the NMOS transistor QN36 keep remaining in the off state at standby time, the logic level of the output signal OUT varies. To cope with this, as in the case of FIG. 16, the first and second activation signals ACTP and ACTN are applied in order to have the transistors QP36 and QN36 intermittently turn on.

As described above, in accordance with the FIG. 17 example, the off-leakage current of the transistors forming the flip-flop in the latch circuit is reduced by devising a circuit configuration, thereby realizing a fast, low-power latch circuit.

Examples of the SRAM memory cell and latch circuit have been explained. These flip-flop type data holding circuits may employ a stack structure of a plurality of stages. For example, if an off-leakage current discharged from an upper-stage data holding circuit is used as power supply current in a lower-stage data holding circuit, this further reduces standby-time power consumption.

The invention claimed is:

1. A data holding circuit comprising:
 a flip-flop which is formed of a plurality of transistors to hold data in memory nodes;
 switch means which is connected between at least one of two power supply lines of said flip-flop and a power supply voltage; and
 control means which controls said switch means to intermittently turn off at standby time.

* * * * *

UNITED STATES PATENT AND TRADEMARK OFFICE
CERTIFICATE OF CORRECTION

PATENT NO. : 5,764,566
DATED : June 9, 1998
INVENTOR(S) : H. AKAMATSU et al.

It is certified that error appears in the above-identified patent and that said Letters Patent is hereby corrected as shown below:

On the title page, item [54]:

IN THE TITLE, Line 4 and column 1:

Delete "STENDLY" and insert -- STANDBY--.

COVER PAGE at [62]

After "October 29, 1996," delete "abandoned" and insert --now U.S. Patent No. 5,734,604.--.

Signed and Sealed this

Twenty-sixth Day of January, 1999

Attest:

Attesting Officer

*Acting Commissioner of Patents and Trademarks*